United States Patent
Lin et al.

(10) Patent No.: US 7,902,649 B2
(45) Date of Patent: Mar. 8, 2011

(54) LEADFRAME FOR LEADLESS PACKAGE, STRUCTURE AND MANUFACTURING METHOD USING THE SAME

(75) Inventors: Chun Ying Lin, Tainan County (TW);
Geng Shin Shen, Tainan County (TW);
Yu Tang Pan, Tainan County (TW);
Shih Wen Chou, Tainan County (TW)

(73) Assignee: Chipmos Technologies Inc., Hsinchu (TW)

( * ) Notice: Subject to any disclaimer, the term of this patent is extended or adjusted under 35 U.S.C. 154(b) by 533 days.

(21) Appl. No.: 11/934,287

(22) Filed: Nov. 2, 2007

(65) Prior Publication Data
US 2008/0258279 A1  Oct. 23, 2008

(30) Foreign Application Priority Data
Apr. 20, 2007  (TW) ................ 96113893 A

(51) Int. Cl.
*H01L 23/495* (2006.01)
(52) U.S. Cl. ....................................... 257/676
(58) Field of Classification Search ........................ None
See application file for complete search history.

(56) References Cited

U.S. PATENT DOCUMENTS

| | | | | |
|---|---|---|---|---|
| 6,060,768 A * | 5/2000 | Hayashida et al. | ........... | 257/666 |
| 6,309,909 B1 * | 10/2001 | Ohgiyama | ........... | 438/112 |
| 6,400,004 B1 | 6/2002 | Fan et al. | | |
| 6,420,779 B1 * | 7/2002 | Sharma et al. | ........... | 257/666 |
| 6,498,392 B2 * | 12/2002 | Azuma | ........... | 257/676 |
| 6,818,973 B1 * | 11/2004 | Foster | ........... | 257/676 |
| 6,876,068 B1 * | 4/2005 | Lee et al. | ........... | 257/676 |
| 6,995,459 B2 * | 2/2006 | Lee et al. | ........... | 257/676 |
| 7,211,471 B1 * | 5/2007 | Foster | ........... | 438/123 |
| 2001/0008305 A1 * | 7/2001 | McLellan et al. | ........... | 257/692 |
| 2002/0140061 A1 * | 10/2002 | Lee | ........... | 257/666 |
| 2002/0163015 A1 * | 11/2002 | Lee et al. | ........... | 257/200 |
| 2003/0073265 A1 * | 4/2003 | Hu et al. | ........... | 438/123 |
| 2005/0139969 A1 * | 6/2005 | Lee et al. | ........... | 257/672 |
| 2006/0035414 A1 | 2/2006 | Park et al. | | |

OTHER PUBLICATIONS

Taiwanese Office Action dated Aug. 13, 2010 for 096113893, which is a Taiwanese counterpart application, that cites US20050139969 and US6060768.

* cited by examiner

*Primary Examiner* — David E Graybill
(74) *Attorney, Agent, or Firm* — WPAT, P.C.; Anthony King

(57) ABSTRACT

A leadframe employed by a leadless package comprises a plurality of package units and an adhesive tape. Each of the package units has a die pad with a plurality of openings and a plurality of pins disposed in the plurality of openings. The adhesive tape is adhered to the surfaces of the plurality of package units and fixes the die pad and the plurality of pins.

12 Claims, 5 Drawing Sheets

US 7,902,649 B2

LEADFRAME FOR LEADLESS PACKAGE, STRUCTURE AND MANUFACTURING METHOD USING THE SAME

BACKGROUND OF THE INVENTION (A) Field of the Invention

The present invention relates to a leadframe for a leadless package, structure and manufacturing method using the same, and more particularly, to the structure of a quad flat non-leaded (QFN) package, a leadframe thereof and a manufacturing method using the same.

(B) Description of the Related Art

To meet electronic devices' requirements for lightness, thinness and small size, QFN packaging has overtaken the traditional leadframe packaging method to replace the more expensive wafer level chip size packaging (CSP). While CSP scales down the package size so that it is the same as the die size, it needs a fine-pitch ball grid array to act as pins, which makes the manufacturing process more complicated. In contrast, QFN packaging is not only with a small size, a low cost and a high manufacturing yield, it is also a high speed and power managing circuit device with a better coplanarity and high heat dissipation capacity. In addition, the QFN packaging does not need to extend the pins from its sides, and therefore its electrical performance is better than the traditional leaded packaging which needs to extend several pins from its sides, and sometime these pins serving as an inductance or a capacitor produce a lot of noise when applied to high frequency systems.

Furthermore, the exposed lead frame pad of QFN packaging can serve as a direct heat dissipation path, which enables the package to exhibit a better heat dissipation capacity. Normally, such a thermal pad is directly soldered on the circuit board, and the thermal via in the circuit board brings the surplus heat to the copper foil connected to the ground, so additional cooling fins can be saved.

FIG. 1 shows the cross-sectional schematic view of a prior art example of a QFN package structure. A QFN packaging element 80 includes a lead-frame 81, a die 82, an adhesive 83, a plurality of leads 84 and a molding material 85, wherein the die 82 is mounted on a die pad 811 of the lead frame 81 by means of the adhesive 83, and the plurality of leads 84 electrically connect the die 82 to a plurality of pins 812 of the lead frame 81. The die 82, the leads 84 and the leadframe 81 are covered with the molding material 85, while the molding material 85 does not cover the lower surfaces of the die pad 811 and the pins 812. The uncovered parts of the surface of the pins 812 act as the contacts of the surface mounting. The uncovered part of the surface of the die pad 811 can dissipate heat directly to outside and therefore replace the heat sink of the prior art serving the same function. However, the die pad 811 is disposed on the center of the pins 812, and needs to be kept at a proper distance from the surrounding pins 812, so the package size is limited. In view of above, because the heat dissipation efficiency is closely related to the package size, if the uncovered area of the surface of the die pad 811 can be increased, it will help solve the more and more serious problem of heat dissipation that a multiple function die especially faces.

SUMMARY OF THE INVENTION

One aspect of the present invention is to provide a leadframe for a leadless package and a package structure and a manufacturing method using the same, which improve the heat dissipation efficiency of the package by modifying the layout of the die pad and the pins in the leadframe.

Another aspect of the present invention is to provide a leadless package structure with steady pins, wherein each pin's four end faces are fixed and protected by a molding material, so that the package is not easily damaged by external forces.

Yet another aspect of the present invention is to provide a leadless package structure with steady pins, wherein each pin has a concave part and a convex part, which increases the area in contact with the molding material and thus reduces the probability of the molding material getting stripped from the pins, improving the manufacturing yield.

A leadframe for leadless package of one embodiment of the present invention comprises a plurality of package units and one adhesive tape. Each package unit has a die pad with a plurality of openings, and a plurality of pins disposed in the plurality of openings. The adhesive tape is adhered to the surface of the plurality of package units to fix the die pad and the plurality of pins.

A package structure for leadless package of another embodiment of the present invention comprises a leadframe, a die and a plurality of lead wires. The leadframe has a die pad with a plurality of openings and a plurality of pins disposed in the plurality of openings. The die is fixed on the die pad and is electrically connected to the pins by the plurality of lead wires.

A manufacturing method for leadless package of yet another embodiment of the present invention comprises the steps of providing a metal sheet covered by an adhesive tape; patterning the metal sheet to form a plurality of package units, wherein each of the package unit has a die pad with a plurality of openings and a plurality of pins disposed in the plurality of openings; mounting one die on each of the die pads; and covering each of the dies, each of the package units and the plurality of lead wires with a molding material.

BRIEF DESCRIPTION OF THE DRAWINGS

The objectives and advantages of the present invention will become apparent upon reference to the following description and the accompanying drawings in which.

DETAILED DESCRIPTION OF THE INVENTION

Figure 2A:
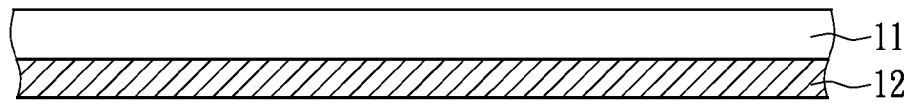
FIGS. 2(a)-2(e) are schematic drawings showing each of the manufacturing steps of a leadless package structure in accordance with an embodiment of the present invention.
Figure 2B:
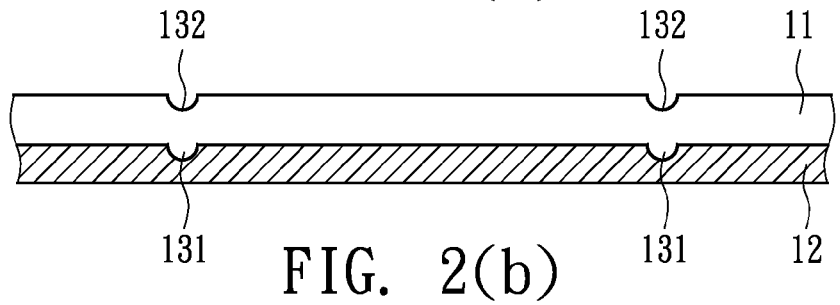
Figure 2C:
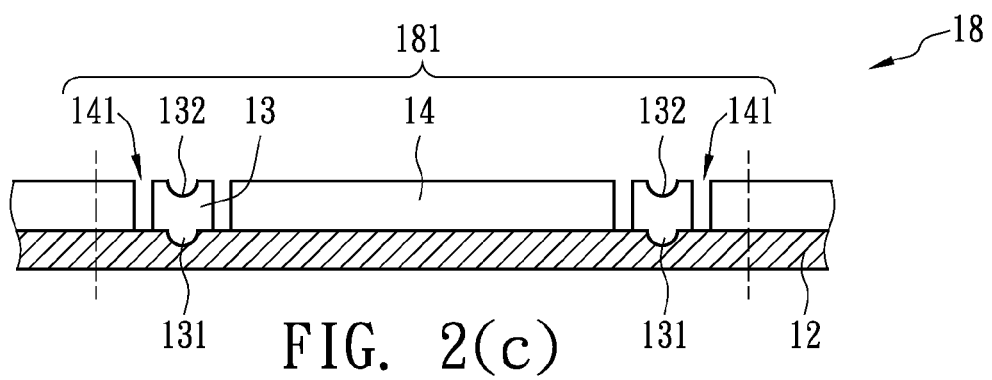

FIGS. 2(a)-2(e) are schematic drawings showing each of the manufacturing steps of a leadless package structure in accordance with an embodiment of the present invention. First, a metal sheet 11 covered by an adhesive tape 12 is provided, wherein the metal sheet 11 can be made of copper, aluminum, Cu—Al alloy, aluminum alloy or a combination of the above materials. As shown in FIG. 2(b), by a stamping process, a plurality of concaves 132 are formed on the upper surface of the metal sheet 11, and therefore a plurality of convexes 131 are formed on the lower surface between the metal sheet 11 and the adhesive tape 12. By a photolithography process, the metal sheet 11 is turned into a plurality of connected die pads 14 and a plurality of separated pins 13, wherein the pins 13 are formed in the plurality of openings 141 of the die pad 14, as shown in FIG. 2(c). And the combination of one of the die pads 14 and its surrounding pins 13 is considered as a package unit 181 of the leadframe 18.

Figure 2D:
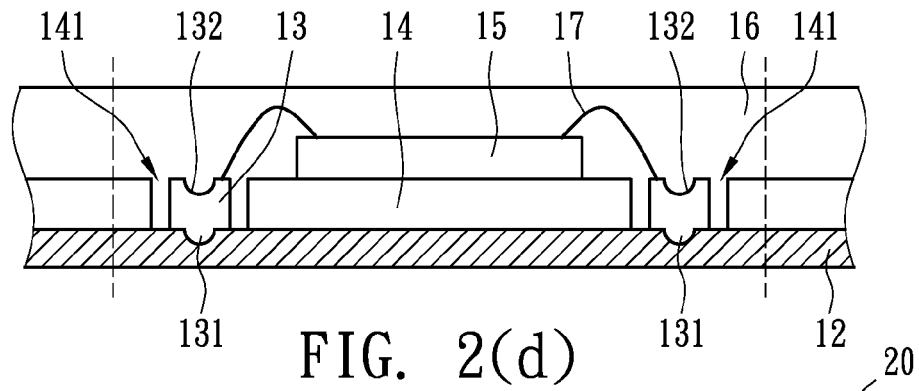
Figure 2E:
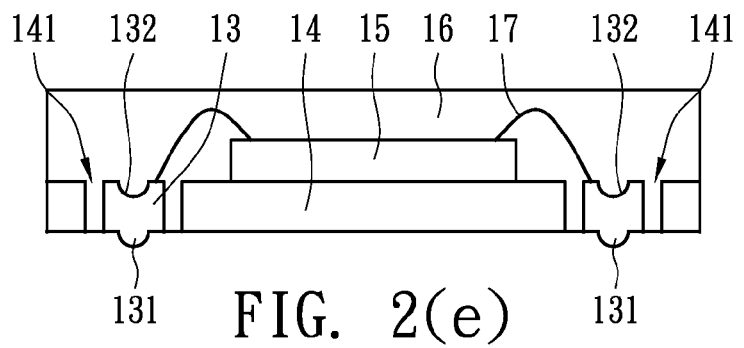
Figure 3:
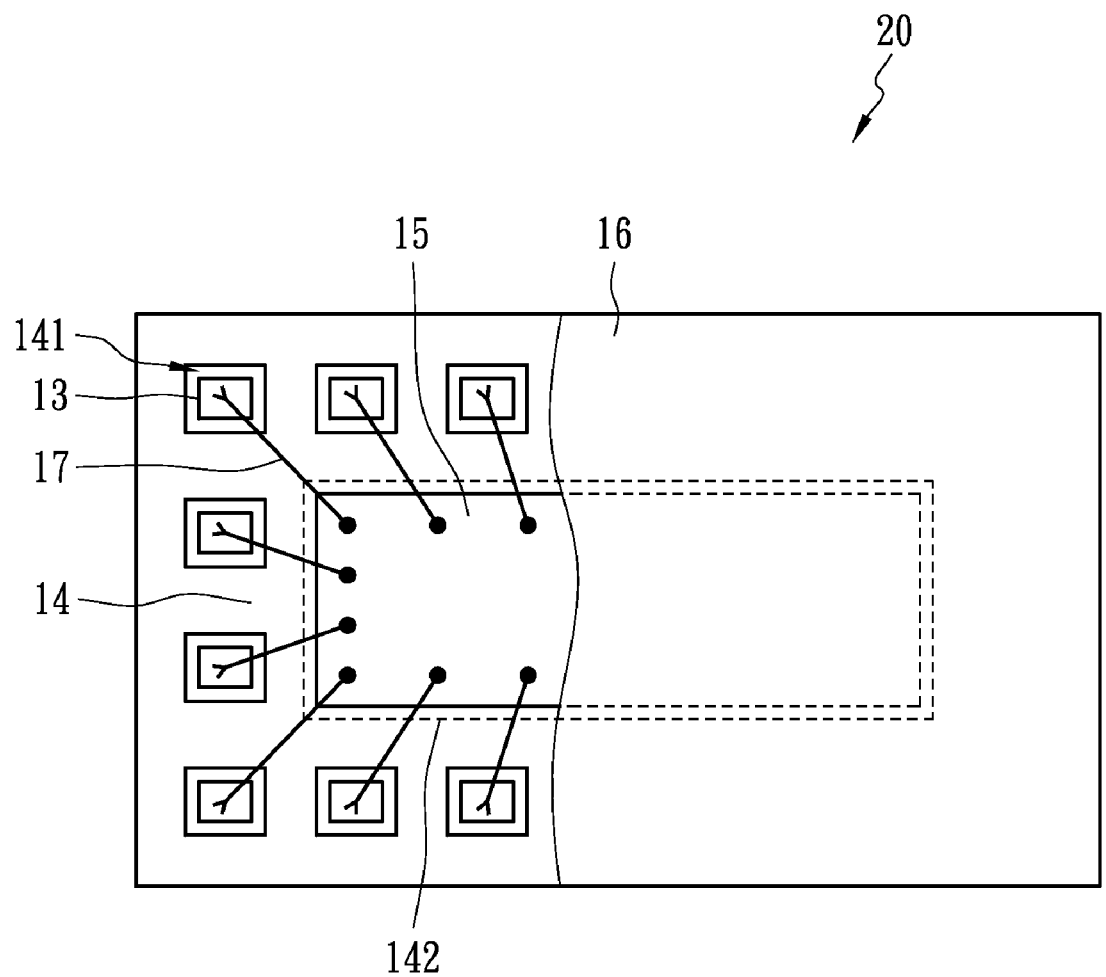
FIG. 3 shows a top view of a leadless package device in accordance with the present invention.

As shown in FIG. 2(d), each die 15 is further mounted on the die fixing area 142 (as shown in FIG. 3) at the center of each die pad 14. A plurality of lead wires 17 connect each die 15 to the pins 13 surrounding it by wire bonding. Preferably, the lead wires 17 are connected to the portions of the pins 13 excluding the concave parts 132. To protect the die 15 and the lead wires 17 from external forces and the environmental influence, each die 15, each package unit 181 and the plurality of lead wires 17 are covered with a molding material 16, as shown in FIG. 2(d). After the molding material 16 hardens, the adhesive tape 12 can be removed, and the leadless package unit 20 is cut along the edges of the package units 181 by a dicing process so that the package units 181 are separated from each other, as shown in FIG. 2(e).

Figure 1:
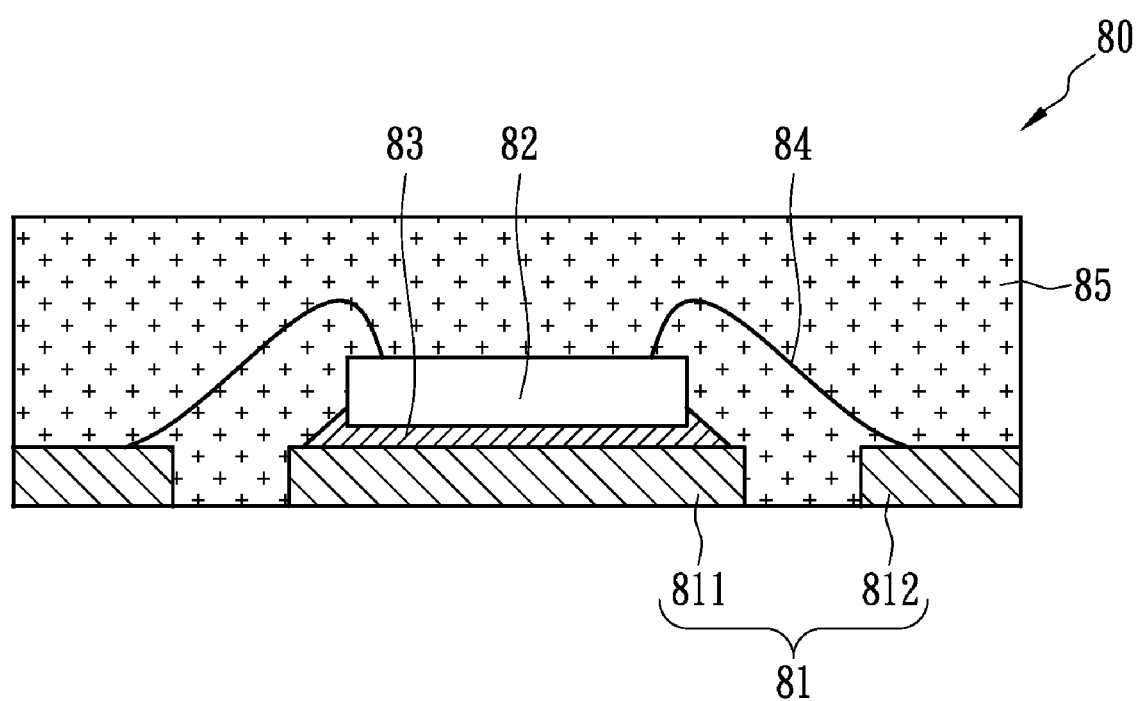
FIG. 1 shows the cross-sectional schematic view of a prior art example of a QFN package structure.

FIG. 3 shows the top view of a leadless package unit in accordance with the present invention. The die 15 is mounted on the die fixing area 142 in the center of the die pad 14, and the plurality of leads 17 are placed on the plurality of openings 141 surrounding the die pad 14. Unlike the QFN package 80 in FIG. 1, the die pad 14 of the present invention extends to the four edges of the leadless package unit 20. Except the openings 141, the whole area of the die pad 14 can dissipate heat. Besides, since the area of the die pad 811 of the conventional QFN package 80 is approximately the same as that of the die fixing area 142 in FIG. 3, the heat dissipation efficiency of these two packages are remarkably different due to the different sizes of the areas of the die pads 14. Furthermore, the four sides of each pin 13 of the present invention are fixed and protected by the molding material 16, so the package is not easily damaged by external forces.

Figure 4:
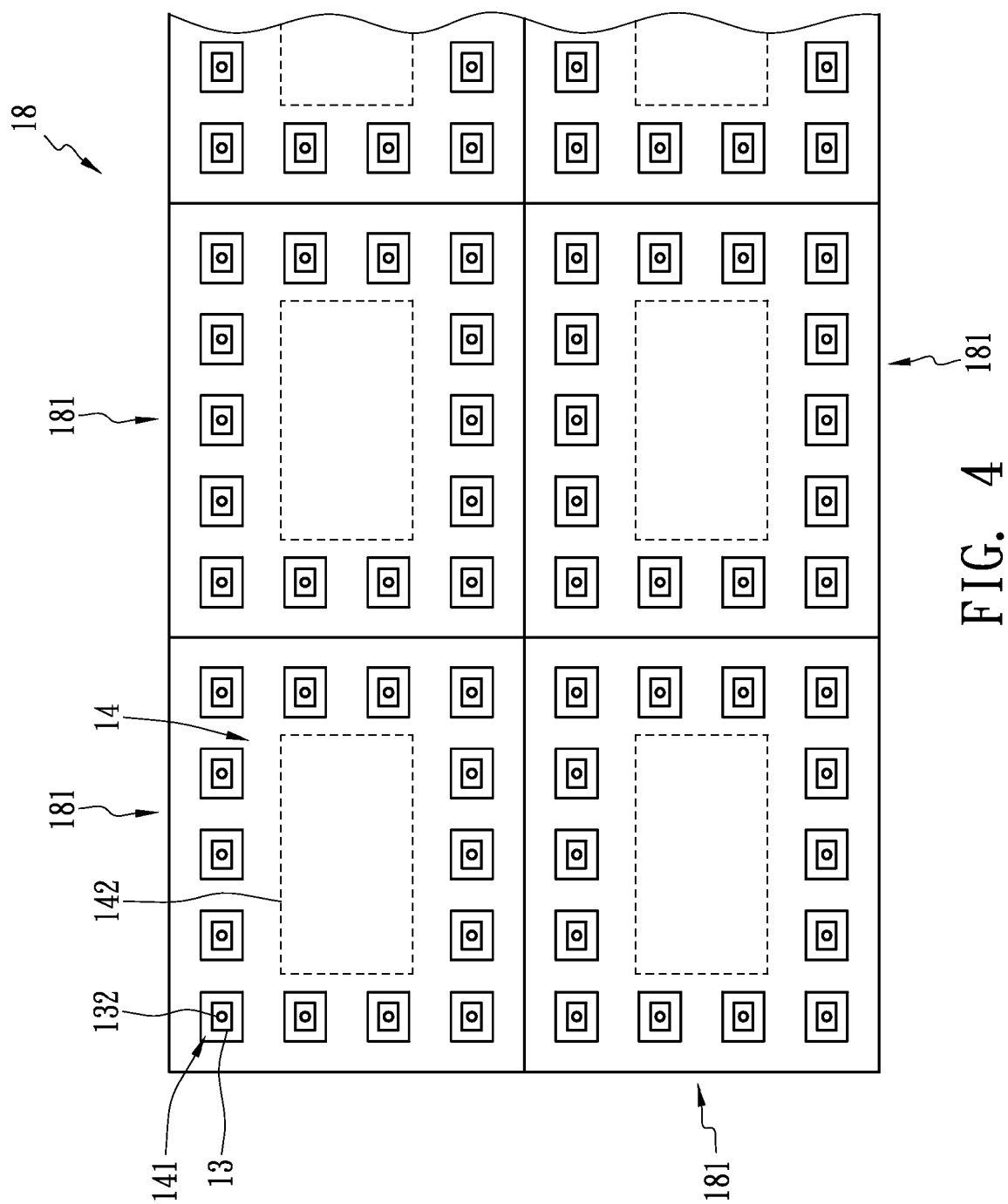
FIG. 4 shows a top view of a leadframe employed by a leadless package in accordance with the present invention.

FIG. 4 shows the top view of a lead frame employed by a leadless package in accordance with the present invention. To meet the requirements of mass production, the plurality of package units 181 of the lead frame 18 can be arranged in M rows by N columns matrix. For example, the package units 181 in FIG. 4 are arranged in two rows by N columns matrix. Instead of such arrangement, there can also be more rows to increase the unit per hour (UPH) of the molding process.

Figure 5A:
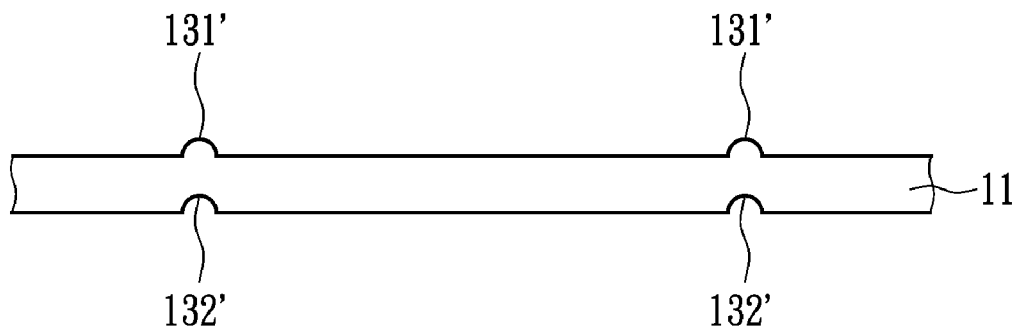
FIGS. 5(a)-5(c) are schematic drawings showing each of manufacturing steps of a leadless package in accordance with another embodiment of the present invention.
Figure 5B:
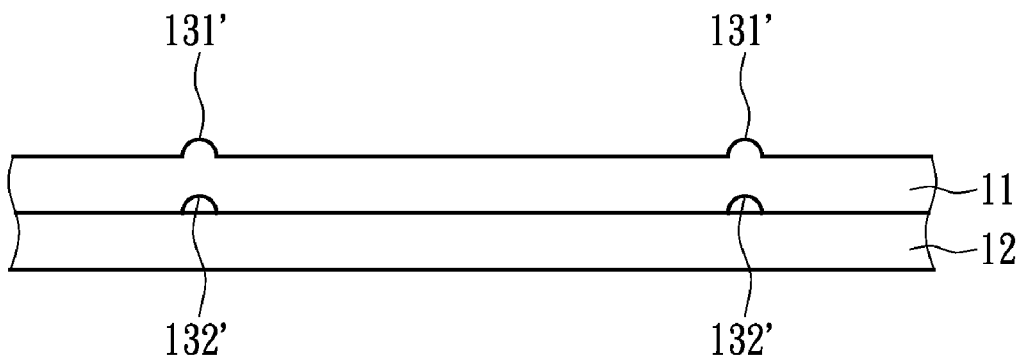
Figure 5C:
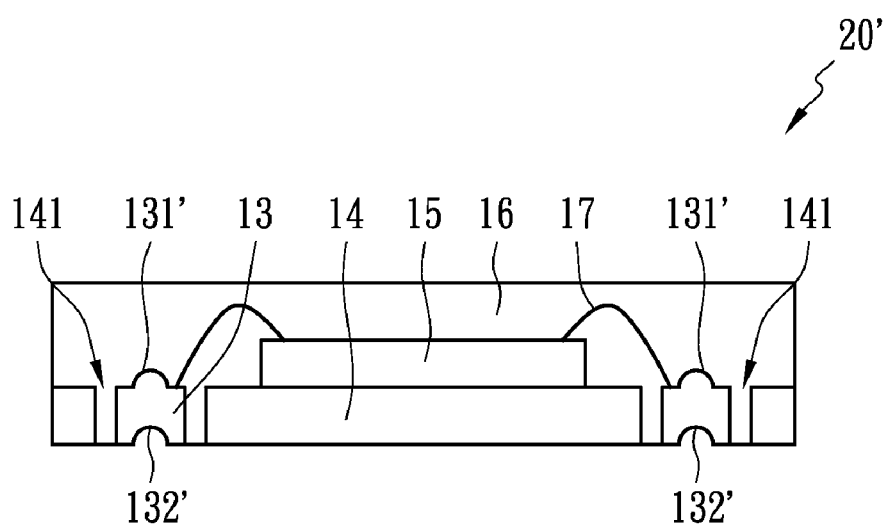

The convex parts 131 of pins 13 on the leadless package unit 20 increase the area in contact with the solders, and therefore enhance the solderability of the leadless package unit 20 in the surface mounting process. The concave parts 132 of pins 13 increase the area in contact with the molding material 16, and therefore reduce the probability of the molding material getting delaminated from the pins 13, which in turn improves the manufacturing yield. As shown in FIG. 5(a), a plurality of concave parts 132' are first formed on one surface of the metal plate material 11, and accordingly a plurality of convex parts 131' are formed on the other surface of the metal plate material 11. Afterward, the plurality of concave parts 132' and the adhesive tape are adhered together, as shown in FIG. 5(b). Then, the same steps in FIG. 2(c) to 2(e) are implemented to complete most of the manufacturing processes. Preferably, the lead wires 17 are connected to the parts of the pins 13 excluding the concave parts 132. Finally, the leadless package unit 20' is cut along edges of the package units 181 by a dicing process so that the package units 181 are separated from each other, as shown in FIG. 5(c). The concave parts 132' of pins 13 of the leadless package unit 20 increase the area in contact with the solders, and therefore enhance the solderability of the leadless package unit 20 in the surface mounting process. The convex parts 131' of pins 13 increase the area in contact with the molding material 16, and therefore reduce the probability of the molding material getting delaminated from the pins 13.

The above-described embodiments of the present invention are intended to be illustrative only. Numerous alternative embodiments may be devised by those skilled in the art without departing from the scope of the following claims.

What is claimed is:

1. A package structure for leadless package, comprising:
   a lead frame, including:
   a die pad with a plurality of openings; and
   a plurality of pins each disposed in one of the plurality of openings respectively, wherein the pins are isolated from each other and isolated from the die pad;
   a die mounted on the die pad; and
   a plurality of lead wires electrically connecting the die and the plurality of pins.

2. The package structure for leadless package of claim 1, wherein the die is fixed on a die fixing area in the center of the die pad.

3. The package structure for leadless package of claim 2, wherein the plurality of openings are disposed around the die fixing area.

4. The package structure for leadless package of claim 1, further comprising a molding material covering the die, the lead frame and the plurality of lead wires, wherein a lower surface of the die pad and the plurality of pins opposite the die are not covered by the molding material.

5. The package structure for leadless package of claim 1, wherein the lower surface of the plurality of pins opposite the die includes a convex part or a concave part.

6. The package structure for leadless package of claim 4, wherein four sides of each of the plurality of pins are covered by the molding material.

7. A package structure for leadless package, comprising:
   a lead frame, including:
   a die pad with a plurality of openings; and
   a plurality of pins each disposed in one of the plurality of openings respectively;
   a die mounted on the die pad; and
   a plurality of lead wires electrically connecting the die and the plurality of pins;
   wherein the die pad extends to four edges of the package structure.

8. The package structure for leadless package of claim 7, wherein the die is fixed on a die fixing area in the center of the die pad.

9. The package structure for leadless package of claim 8, wherein the plurality of openings are disposed around the die fixing area.

10. The package structure for leadless package of claim 7, further comprising a molding material covering the die, the lead frame and the plurality of lead wires, wherein a lower surface of the die pad and the plurality of pins opposite the die are not covered by the molding material.

11. The package structure for leadless package of claim 10, wherein four sides of each of the plurality of pins are covered by the molding material.

12. The package structure for leadless package of claim 7, wherein the lower surface of the plurality of pins opposite the die includes a convex part or a concave part.

* * * * *